INVENTORS
DAIZO NUKIYAMA
NORIYUKI MIYAZAKI

Wolfe, Hubbard, Voit & Osann
ATTYS.

Sept. 22, 1970 DAIZO NUKIYAMA ET AL 3,530,403

OSCILLATOR

Filed Nov. 7, 1967 2 Sheets-Sheet 2

INVENTORS
DAIZO NUKIYAMA
BY NORIYUKI MIYAZAKI
Wolfe, Hubbard, Voit & Osann
ATTYS.

United States Patent Office 3,530,403

Patented Sept. 22, 1970

3,530,403

OSCILLATOR

Daizo Nukiyama, 5–9 Nishikata, 1-chome, Bunkyo-ku, Tokyo, Japan, and Noriyuki Miyazaki, 12–9 Hon-Kugenuma, 3-chome, Karagawa-ken, Fujisawa, Japan Filed Nov. 7, 1967, Ser. No. 681,290
Claims priority, application Japan, Nov. 8, 1966, 41/73,030; Dec. 19, 1966, 41/82,762; Aug. 10, 1967, 42/50,974
Int. Cl. H03b *5/30*
U.S. Cl. 331—156 6 Claims

ABSTRACT OF THE DISCLOSURE

An oscillator comprising a nonmagnetic mechanical vibrator arranged in a DC magnetic field, an amplifier having said mechanical vibrator connected to its input side, and a circuit feeding the output of said amplifier back to said mechanical vibrator.

Generally, as sine wave oscillators generating sine waves, there are an LC oscillator having an LC resonance circuit of an inductance L, capacitance C and resistance R, and RC oscillator utilizing an RC circuit and a mechanical vibrator oscillator utilizing a mechanical vibrator. As mechanical vibrators, there are a quartz crystal vibrator utilizing a piezoelectric effect and magnetostriction vibrator. Further, there are a tuning fork and tuning bar. The mechanical vibrator according to the present invention is to make a pure mechanical vibration with a permanent magnet and take an electric output directly from said mechanical vibrator by utilizing an electromagnetic action. The vibration frequency of the mechanical vibrator according to the present invention is a low frequency and can be directly used in a low frequency oscillator.

A principal object of the present invention is to provide an oscillator which is of a low frequency and in which the adjustment of the vibration frequency is easy and the frequency is stabilized.

Another object of the preesnt invention is to provide an oscillator which is small in size, and little influenced by the external impact, and for which the acquirement of the vibrator is easy.

Other objects and advantages of the present invention will become clear when the following detailed explanations are read with reference to the drawings in which.

Figure 4:
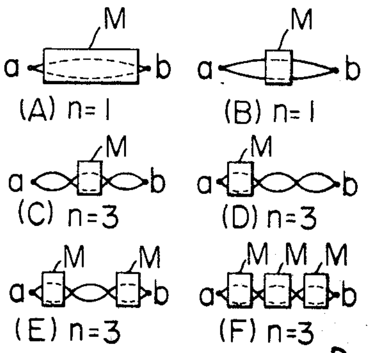
Figure 5:
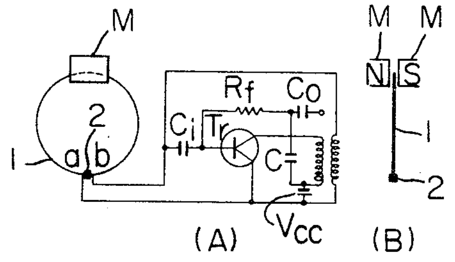
Figure 6A:
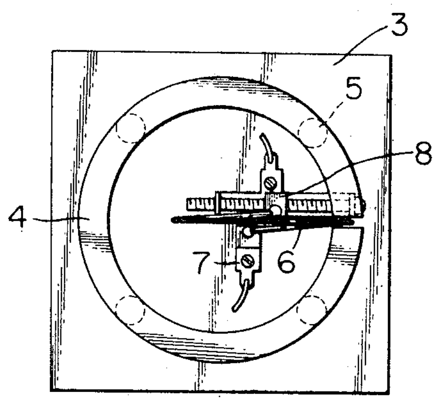
Figure 7:
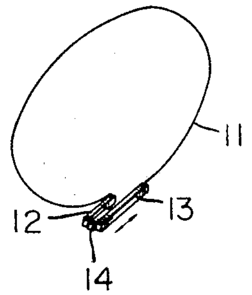
Figure 6B:
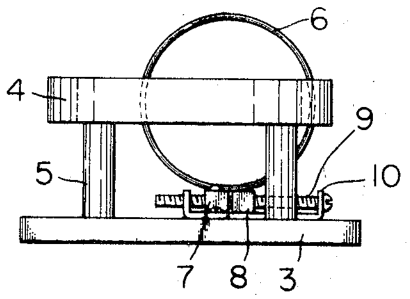
Figure 8:
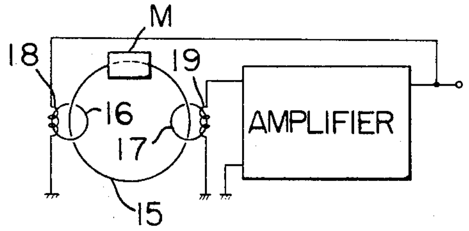

A, B, C, D, E and F in FIG. 4 shows relations between the number of magnets and the harmonic vibration;

FIG. 5 shows the second embodiment of an oscillator of the present invention;

FIG. 6 shows an embodiment of a mechanical vibrator of the second embodiment, A being a plan view and B being a side view;

FIG. 7 shows an embodiment for compensating the variation of the natural frequency of a wire vibrator;

FIG. 8 shows the third embodiment of an oscillator of the present invention;

The present invention shall be explaind with reference to its preferable embodiments but is not to be limited to the specific embodiments shown herein and is rather to include various modifications and equal arrangements to be included in the claims and their spirit.

Figure 1:
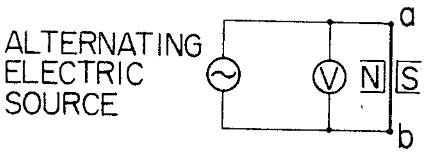
FIG. 1 is an explanatory view explaining the principle of an oscillator of the present invention.

FIG. 1 shows an explanatory view of the principle of the present invention. When a proper tension, length and line density are given at *a* and *b* to a linear wire to be a mechanical vibrator, said wire is placed in a magnetic field of a permanent magnet N and S and an electric current of a frequency coinciding with the natural frequency of the linear wire vibrator determined by the given tension, length and line density is made to flow between the terminals of the above mentioned vibrator, the above mentioned linear wire vibrator will resonate and will start a vibration of a large amplitude due to an electromagnetic action. As the wire cuts the magnetic flux of the magnetic field due to this vibration, an induced electromotive force will be produced there. An induction current thereby will also vibrate the wire with an external magnetic field. Thus, these relations will be kept in equilibrium and will keep on a stable vibration. The present invention is to obtain a stable oscillator by utilizing the above mentioned linear wire vibrator as a mechanical vibrator in an oscillation circuit.

If the wire to be a mechanical vibrator is a wire of a very low internal resistance, when it is stationary, its impedance will be substantially equal to zero. But, if this wire is placed in the external magnetic field and an alternating current of a certain frequency is made to flow through it, the wire will vibrate. It is electrically considered in view of the alternating current that, while this wire to be a mechanical vibrator is vibrating, a two-terminal impedance will be formed. That is to say, it is considered that, while the wire is vibrating, it will be equivalent to a resonance circuit formed by a circuit constant of an inductance L, cacapitance C and resistance R.

Figure 2:
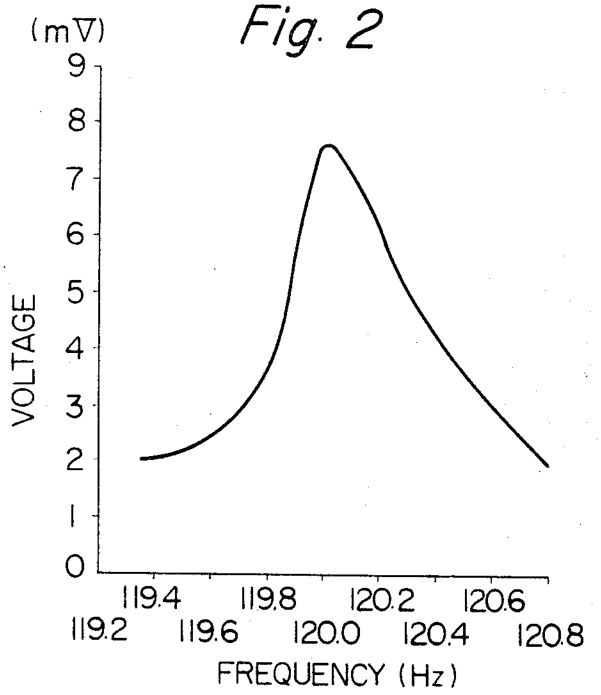
FIG. 2 is a curve showing a resonance state of a wire vibrator.

FIG. 2 shows results in an experimental example in which a wire of a thickness of 0.2 mm. in diameter and a length of 78 mm. made of Phosphor bronze was arranged in a direct current magnetic field of 8000 gausses magnetic flux density, an alternating current was made to flow through said wire and the voltage between both terminals of the wire was measured. It is thereby recognized that the wire oscillated at 120 Hz.

Figure 3:
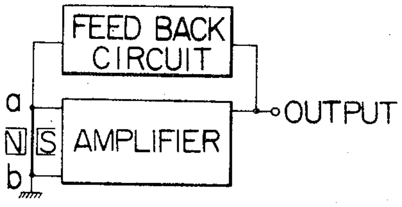
FIG. 3 shows the first embodiment of an oscillator of the present invention.

FIG. 3 shows an embodiment of the present invention wherein a linear wire to be a mechanical vibrator is connected to the input terminal of an amplifier so that, when a part or all of its output is fed back to the input side through a proper feed back circuit by taking the phase into consideration, an oscillation circuit may be formed. Needless to say, it is assumed that the gain of the amplifier and other oscillating conditions are satisfied. If any impetus (such as a noise in the amplification circuit or switching of the electric source switch) is given to said circuit, when it is amplified, is fed back and is kept in equilibrium, a stable oscillation will be continued. In the wire which is a mechanical vibrator, at a frequency different from the natural frequency, the impedance between the two terminals will be so small as to be considered to be substantially zero and these two terminals will be considered to be short-circuited. At this time, the oscillation circuit will not operate and will cause no oscillation. When the frequency of the current flowing through the wire which is a mechanical vibrator approaches the natural frequency of said wire, the vibration amplitude will quickly become larger and, when it coincides with the natural frequency, the wire will resonate and its amplitude will become maximum. That is to say, at its natural frequency, the mechanical vibrator will form the maximum two-terminal impedance and the wire which is a mechanical vibrator will act as a mechanical resonator. Therefore, only at this frequency, the oscillation circuit in FIG. 2 will also operate.

The vibration frequency $f$ of a given linear string is represented generally by a function F of the tension T, length $l$ and line density $\lambda$ of the string as follows:

$$f=n\times F(T, l, \lambda) \quad (1)$$

wherein $n$ is a harmonic vibration.

FIG. 4 shows relations of the positions of the magnetic poles and the width of a permanent magnet placed so that its magnetic field may link a string which is a mechanical vibrator by giving the string a proper tension, length and line density, the number of such permanent magnets and the harmonic vibration *n*. Each of A, B, C and D in FIG. 4 shows a case that one permanent magnet is used for the string wire which is a mechanical vibrator. E and F show cases that two and three permanent magnets are used, respectively. Especially, each of A, B and C in FIG. 4 is of a case that the magnetic poles of the permanent magnet are placed in the middle of the string wire. D in FIG. 4 shows a case that the magnetic poles have been moved along the string wire. As understood from FIG. 4, in any case, it is desirable that the positions of the magnetic poles of the permanent magnet are placed in the part of the loop (where the amplitude is maximum) of the vibration when the string wire vibrates. However, when two or more permanent magnets are used, the directions of the magnetic fields linked with the string wire will become a problem and therefore it will be necessary to arrange them so that S and N may be alternate.

FIG. 5 shows the second embodiment of the present invention. Whereas the mechanical vibrator in the first embodiment is caused by the tension of the linear wire, the wire in the second embodiment is made in the form of a ring, is vibrated by the tension and has therefore a great feature that the vibration is an elastic vibration by the elasticity of the ring. In this respect, the vibration of the ring-shaped wire vibrator in the second embodiment resembles that of a quartz crystal vibrator physically very closely. When the wire which is a mechanical vibrator is made in the form of a ring and is elastically vibrated, the influence of the temperature on its natural frequency will be able to be made very small, the manner of fixing the wire will not be unreasonable and therefore the variation with the lapse of years will be little.

In FIG. 5, 1 is a ring-shaped wire of a nonmagnetic material to be a mechanical vibrator, 2 is an insulator and the ring-shaped wire vibrator 1 is fixed at the terminals *a* and *b* with the insulator 2 held between them. M is a permanent magnet and N and S are its magnetic poles. $T_r$ is a transistor, T is a transformer, $V_{cc}$ is an electric source cell, $C_1$, C and $C_o$ are condensers and $R_f$ is a resistor. The oscillation output is to be taken out of the collector of the transistor $T_r$ through the condenser $C_o$. As in A in FIG. 5, the wire to be a mechanical vibrator is made in the form of a ring (for example, a circular ring) and the magnetic poles N and S of the permanent magnet are placed in specific positions on the periphery of the ring so that their magnetic field may be linked with the wire and are connected to the oscillation circuit. Then, this oscillator will oscillate at a frequency substantially coinciding with the natural frequency of the ring-shaped wire vibrator which is a mechanical vibrator. The natural frequency *f* of this ring-shaped wire vibrator is represented as a function of the stiffness T of the ring-shaped wire vibrator, the length *l* of the periphery of the ring and the line density $\rho$ as follows:

$$f=n\times F(T, l, \rho) \qquad (2)$$

wherein *n* is an *n* harmonic vibration. The object natural frequency of the ring-shaped wire vibrator is determined by adjusting the respective elements in the Formula 2. As one method thereof, even in a ring-shaped wire of the same length and line density, by slightly varying the distance between the terminals *a* and *b*, the natural frequency can be adjusted and thereby the continuous variation of the frequency is possible.

FIG. 6 shows an embodiment of a vibrator in which the natural frequency is made adjustable. In the drawing, 3 is a base made of an insulator, 4 is a ring-shaped magnet secured on the base 3 with four legs 5, 6 is a ring-shaped wire fixed at one end to a fixed terminal 7 and at the other end to a movable terminal 8. Said fixed terminal 7 is secured to the base 3. Said movable terminal 8 is screwed on a bolt 9 which is loosely fitted in a U-shaped supporter. When the bolt 9 is rotated, the movable terminal 8 will move to the right and left on the bolt so that thereby the natural frequency of the wire 6 may be adjusted.

FIG. 7 shows an embodiment for compensating the variation of the natural frequency of the wire vibrator by the temperature. Metal pieces 12 and 13 different in the coefficient of linear expansion are secured to the respective ends of a ring-shaped wire 11 with an insulator 14 interposed between them. Thereby the influence of the temperature on the modulus of elasticity and the length of the ring-shaped wire which are elements to determine the natural frequency of the ring-shaped wire vibrator can be made to approach zero. Further, bimetals can be used instead of the above mentioned metal pieces 2 and 3. In the above embodiments, circular wires have been explained. However, as a matter of fact, so long as the vibration is an ealstic vibration, the same result will be obtained with a wire of any form as a mechanical vibrator. That is to say, if the vibration of the mechanical vibrator is an elastic vibration of a wire, the oscillator using such mechanical vibrator will operate with a stable frequency. Concretely, the wire may be of an ellipse, $1/n$ circle or any other form having no sharp bend. Further, the method of generating a harmonic vibration is exactly the same as in the first embodiment.

In the second embodiment shown in FIG. 5, as there are two terminals to be fixed, the manner of fitting them has been a problem. As these two points are forcibly fixed points, when the wire vibrates, the mechanical vibration will be transmitted out of these two points, will become a mechanical loss and will influence the electric oscillating circuit in case such mechanical vibrator is used in an oscillator. In the third embodiment, the two forcibly fixed points are eliminated and the points to be fixed are made free. That is to say, the wire is closed and the closed ring-shaped wire vibrator to be vibrated is lightly supported in the part of a node of the vibration. The displacement of the node produced at the time of the vibration is always zero. Therefore, if the vibrator is fitted at such node, the mechanical vibration energy will not be lost through the fixed point and therefore a vibrator of a small mechanical loss will be obtained.

FIG. 8 shows the third embodiment. In the drawing, 15 is a closed ring-shaped wire of a nonmagnetic material and 16 and 17 are ring-shaped cores linked with the above mentioned ring-shaped wire 15, 18 and 19 are coils wound respectively on said cores. The coil 18 is connected at one end to the output side of an amplifier and is grounded at the other end. The coil 19 is connected at one end to the input side of the amplifier and is grounded at the other end. M is a permanent magnet having its magnetic poles N and S placed in specific positions of the closed ring-shaped vibrator which is a mechanical vibrator so that the magnetic field of the magnetic poles N and S of the permanent magnet may be linked with the closed ring-shaped wire, an induction current may be passed through the closed ring-shaped wire vibrator by an electromagnetic action and an induction voltage may be induced in the coil 19 wound on the core 17 by the magnetic field produced by said current. This induction voltage is made an input of a proper amplifier and is amplified therein and the output of the amplifier is fed back to the closed ring-shaped wire vibrator which is a mechanical vibrator through the coil 18 and core 16 (considered to be a transformer) so that the above mentioned vibrator may be vibrated, an oscillation circuit may be formed and a stable oscillation may be continued. In such case, as the closed ring-shaped wire vibrator which is a mechanical vibrator is lightly fitted at all or a part of the nodes of its vibration as fixed points, it will be able to be operated as a vibrator of a small mechanical loss. Further, as there are a plurality of nodes of the vibration due to the vibration frequency, any of them can be selected and fixed. Further, several nodes can be freely determined as fixed points. This mechanical vibrator can be operated as a vibrator strong also against external vibrations and impacts. Further, when the closed ring-shaped wire vibrator which is a mechanical vibrator performs an elastic vibration, it will be exactly the same as in the case of the second embodiment. Therefore, it is natural that an oscillator of a stable frequency will be obtained. Further, the method of generating a harmonic vibration is exactly the same as in the second embodiment. The Formula 2 applies also to the natural frequency of the closed ring-shaped wire vibrator.

When a part or all of the oscillating apparatus except the cell is put in an airtight container and the air is taken out of the container, the precision of the oscillator will be able to be elevated.

As the oscillator according to the present invention utilizes a mechanical vibrator made by making a wire in the form of a ring so as to perform an elastic vibration as described above, it has features (a) That the loss is very small and the efficiency is high, (b) That the total energy required for the oscillation is little and yet the output is high, (c) That such stable oscillation frequency as about 50 to 10,000 Hz. can be obtained, (d) That the oscillation frequency will be determined only by the physical properties of the elastic wire which is a mechanical vibrator and the intensity of the magnetic field of the permanent magnet will have a secondary influence through the vibration amplitude of the wire which is a mechanical vibrator and (e) That the mass of the vibrator is so small as to be little influenced by external impacts, that is to say, its own elastic energy is far larger than the kinetic energy applied to the vibrator by an impact.

The data in an actual example of operating a clock in the embodiments in FIGS. 5 and 6 are shown for information in the following.

The wire vibrator was of a material of Phosphor bronze, a diameter of 0.2 mm., a length of 103 mm. and a natural frequency of 50 Hz. The magnetic flux density in the gap of the magnet was 8000 gausses. In the circuit, the electric source was a mercury cell of 1.3 v., the transformer was of an impedance ratio of 1200:8, $C_1$ was of 30 $\mu$F, $C_0$ was of 0.1 $\mu$F, C was of 5 $\mu$F, $T_r$ was of a silicon NPN type and $R_f$ was of 60 K$\Omega$. In the adjustment of the frequency, the frequency was varied by 0.1 Hz. by moving the movable terminal by 0.5 mm. with the bolt. When a clock mechanism was operated with a synchronous motor by amplifying this alternating current output of 50 Hz., a daily rate of $\pm 2$ seconds was obtained.

What is claimed is:

1. An electromechanical oscillator comprising the combination of means for generating a DC magnetic field, an electronic amplifier having input and output means, and a feedback circuit operatively connected to said amplifier for producing an oscillating output, said feedback circuit including a nonmagnetic mechanical vibrator disposed in said DC magnetic field, said vibrator comprising a closed ring of resilient wire mounted for vibration at a predetermined natural frequency of vibration, a pair of cores operatively associated with said resilient wire ring on opposite sides thereof, a first winding operatively connected to said amplifier input wound on one of said cores, and a second winding operatively connected to said feeback circuit wound on the other of said cores.

2. An electromechanical oscillator as set forth in claim 1 which includes means for adjusting said mechanical vibrator to vary said predetermined natural frequency of vibration.

3. An electromechanical oscillator as set forth in claim 1 wherein said vibrator comprises an open ring of wire with an insulating element disposed between the opposite ends thereof, and with one end of said wire connected to said amplifier input and the other end of said wire connected to said feedback circuit.

4. An electromechanical oscillator as set forth in claim 1 which includes means forming a plurality of equally spaced nodal points around said resilient wire ring.

5. An electromechanical oscillator as set forth in claim 1 wherein said means for generating a DC magnetic field is a permanent magnet located midway between a pair of nodal points on said resilient wire ring.

6. An electromechanical oscillator as set forth in claim 1 wherein the opposite ends of said resilient wire ring are connected to two different mounting elements having different predetermined thermal coefficients of linear expansion for maintaining a substantially constant frequency when said resilient wire ring is subjected to varying temperatures.

References Cited

UNITED STATES PATENTS

| | | | |
|---|---|---|---|
| 2,435,487 | 2/1948 | Adler | 331—157 |
| 2,447,816 | 8/1948 | Rieber | 331—156 |
| 2,455,021 | 11/1948 | Rieber | 331—156 |
| 2,546,158 | 3/1951 | Johnson | 331—156 |
| 2,689,943 | 9/1954 | Rieber | 331—156 |
| 2,956,242 | 10/1960 | Grib | 331—156 |

FOREIGN PATENTS

| | | |
|---|---|---|
| 1,380,257 | 1/1964 | France. |

JOHN KOMINSKI, Primary Examiner

U.S. Cl. X.R.

331—116